United States Patent [19]

Strauss

[11] Patent Number: 5,416,431

[45] Date of Patent: May 16, 1995

[54] INTEGRATED CIRCUIT CLOCK DRIVER HAVING IMPROVED LAYOUT

[75] Inventor: Mark S. Strauss, Allentown, Pa.

[73] Assignee: AT&T Corp., Murray Hill, N.J.

[21] Appl. No.: 216,203

[22] Filed: Mar. 21, 1994

[51] Int. Cl.[6] .......................................... H03K 19/094
[52] U.S. Cl. ...................................... 326/95; 326/103; 257/207; 257/211
[58] Field of Search ................ 257/207, 211, 369, 401; 307/443, 480, 481, 482.1, 303.1

[56] References Cited

U.S. PATENT DOCUMENTS

| | | | |
|---|---|---|---|
| 4,570,176 | 2/1986 | Kolwicz | 357/42 |
| 4,740,825 | 4/1988 | Saeki | 257/207 X |
| 4,906,872 | 3/1990 | Tanaka | 307/480 |
| 4,958,092 | 9/1990 | Tanaka | 307/480 |
| 5,087,955 | 2/1992 | Futami | 257/211 X |
| 5,291,043 | 3/1994 | Arakawa | 257/207 X |
| 5,345,098 | 9/1994 | Hirabayashi et al. | 257/207 |
| 5,355,004 | 10/1994 | Saitoh | 257/211 |

FOREIGN PATENT DOCUMENTS 405121548A 5/1993 Japan ................ 307/482.1

OTHER PUBLICATIONS

TI Design Manual for TGB1000/TEB1000 BICMOS Arrays, 1992, pp. 2–16 through 2–21 and 7–16 through 7–23.

Primary Examiner—David R. Hudspeth
Attorney, Agent, or Firm—James H. Fox

[57] ABSTRACT

An application specific integrated circuit (ASIC) clock driver is built under the power supply second level (metal2) buses, with the p-channel and n-channel transistors lying under the $V_{DD}$ and $V_{SS}$ buses, respectively. The transistor gates in the clock driver are placed orthogonally with respect to the transistor gates in the polycells. This allows for easy access to the metal2 bus and eliminates the need for the clock driver transistors to "add to" the current flowing through the first level (metal1) $V_{DD}/V_{SS}$ buses in the polycell row. Therefore, electromigration concerns are reduced for: (1) the core logic polycells; (2) within the clock driver itself; and (3) on the metallization of the output of the clock driver, since the clock driver typically drives large capacitive loads. The orthogonal layout scheme also allows for full contact of the transistors source and drain regions to the corresponding metal bus, providing for low series resistance. Individual clock drivers may be readily paralleled into a main clock driver in the same vertical section ("spine"), and more than one main clock driver may be placed in a spine.

12 Claims, 3 Drawing Sheets

INTEGRATED CIRCUIT CLOCK DRIVER HAVING IMPROVED LAYOUT

BACKGROUND OF THE INVENTION

1. Field of the Invention

The present invention relates to an integrated circuit having a clock driver.

2. Description of the Prior Art

One type of integrated circuit (IC) is frequently referred to as an ASIC (Application Specific Integrated Circuit). This type is constructed of so-called "standard cells", alternatively referred to as "polycells", that implement defined circuit functions, and are laid out in a pattern which allows one polycell to easily communicate with other polycells. In this manner, a relatively complex integrated circuit may be constructed using polycell circuitry, and various ones of the polycells may then be reused in still other IC designs. This is convenient for computer-aided design, for example, wherein pre-defined polycells are stored in a software "library" that may be called upon as needed. The transistors in the polycells may be formed, for example, according to the transistor isolation technique described in U.S. Pat. No. 4,570,176 "CMOS Cell array with transistor isolation", which is co-assigned herewith. In order to facilitate the layout of the integrated circuit, the core logic of an ASIC chip is composed of many rows of polycells. The polycells typically implement the common logic functions (AND gates, OR gates, etc.), as well as providing clock drivers. However, whatever the electrical function, the polycells in the prior art have been similarly constructed in physical layout, with the transistor gates running orthogonally with respect to the row direction.

For example, referring to FIG. 1, an illustrative polycell design implemented with two metal conductor levels is shown. Each polycell row runs horizontally as viewed, whereas the transistor gate conductors (109, 116) run vertically. In the illustrative CMOS case, p-channel and n-channel transistors have source/drain regions formed in underlying n-regions and p-regions, respectively. These underlying doped regions (not shown) may be formed in a semiconductor substrate by a single-tub, twin-tub, or other production process technique as known in the art. Each gate conductor shown (109, 116) is common to both a p-channel transistor having p-type source (112, 117) and drain (110, 119) regions, and an n-channel transistor having n-type source (115, 120) and drain (113, 122) regions. Although only two pairs of transistors are shown in the row, typically dozens or more are provided in a given row. The vertical gate conductor layout (i.e., orthogonal to the row axis) was chosen in the prior art to provide for convenient inter-cell connection, and to improve the efficiency of space utilization. That is, various logic types (NAND gates, NOR gates, etc.) are easier to stack side-by-side when the transistor gates are vertical. This is due in pan to the fact that the gates of complementary transistors may be formed from a continuous conductor strip. That is, conductors 109 and 116 each serve as the gate conductor for both an n-channel and a p-channel transistor, without the necessity of a window to a metal layer for interconnection of the n-channel and p-channel gate conductors.

In providing signal and power connections to and among the various polycell transistors, the first metal level ("metal1") is typically used for power supply busses and also for intra-cell signal routing within the row, and for inter-cell routing between the rows in routing channels that are parallel to the rows. For example, $V_{DD}$ bus 102 and $V_{SS}$ bus 105 are typically implemented in metal1. The source regions contact the appropriate power supply bus by means of contact windows (111, 114, 118, 121) formed in the dielectric layer (not shown) overlying the source/drain regions. Furthermore, in a complementary transistor pair, a p-type source region (110) is connected to an n-type drain region (113) by means of a metal1 layer and contact windows, both not shown for clarity. The second metal level ("metal2") is typically used for inter-cell routing vertically. The positive ($V_{DD}$) and ground ($V_{SS}$) power supply buses (102, 105 respectively) run along (i.e., parallel to) the axis of the row for its entire length. These metal1 buses are fed from positive ($V_{DD}$) and ground ($V_{SS}$) metal2 buses (101,104), which run orthogonally to the rows. These latter busses, which are vertical as viewed in FIG. 1, are also referred to as "spines" herein, with the spine 101 contacting bus 102 by means of conductive vias 103, and spine 104 contacting bus 105 by means of vias 106. The vias are formed in the dielectric layer (not shown) separating the metal1 and metal2 layers in a manner known in the art.

In prior-art designs using two metal levels with orthogonal conductors, it is known to place circuitry, which may include clock drivers for example, underneath metal2 conductors, including the power supply conductors in regions 107, 108. The sources of the transistors in such circuitry could then be connected directly to the metal2 spines. This is possible because the second metal level is used for power supply distribution and vertical inter-cell connections. The horizontal inter-cell connections are typically provided by the first level metal conductors in the routing channels. However, in the case of a typical prior-art three metal-level design, the area under the metal2 $V_{DD}$ and $V_{SS}$ power supply spines are void of polycells, at least in designs that use metal2 input/output terminals to provide for inter-cell connection. That is, if the polycells in such designs were placed under the metal2 power supply spines, then the input and output terminals would be shorted to either $V_{DD}$ or $V_{SS}$. Therefore, the area under the metal2 power supply spines may be wasted space in the three metal- level designs.

Each polycell logic gate, in performing its task, charges and/or discharges a capacitive load. The current required to charge/discharge this capacitance is supplied through the $V_{DD}/V_{SS}$ metal1 buses. Furthermore, the current $I_1$ flowing through spine 101 supplies currents 12 and 13 flowing in both the left- and right-hand portions of bus 102, respectively. In addition, still additional current components may contribute to $I_1$ from the $V_{DD}$ busses in any other rows (not shown) connected to this spine. (Similarly, return current 16 is the sum of $I_4$, $I_5$ from bus 105, and currents from any other $V_{SS}$ busses connected to this spine.) Electromigration of the $V_{DD}/V_{SS}$ metal1 buses, as well as the metal2 spines, is therefore a valid concern in polycell logic cells. Guidelines are often established to calculate the maximum number of polycells between two metal2 power or ground buses. These guidelines are based on an average capacitive load (fanout), operational frequency, and percent of time active, for each polycell and the $V_{DD}/V_{SS}$ metal1 bus widths in the polycells.

The clock drivers noted above are circuits for distributing clock signals from one or more clocks to the polycell circuitry in the various rows. An illustrative two-stage clock driver implemented in CMOS technology is shown in FIG. 2. The p-channel transistor 21 and n-channel transistor 22 comprises a first complementary inverter stage, whereas transistors 23 and 24 comprises a second complementary inverter stage. This clock driver receives a clock signal "A" from a clock source that may be on the same, or alternatively a different, integrated circuit as the clock driver. The clock driver in turn provides an output signal "Z" for driving a desired number of polycells in one or more of the various rows. In this manner, the clock driver provides a sufficient drive signal to drive the required load, as typically determined by the magnitude of the switching current that is required to drive the load. While a two-stage design is illustrated, in some cases only a single-stage clock driver is required, while in other cases, three or more stages are used. The clock driver circuitry is different than logic circuitry in that the clock driver circuitry usually drives a load that is an order of magnitude or more greater than the load driven by any given logic polycell. Thus, the clock driver circuit requires more current than the standard polycells, increasing electromigration concerns.

SUMMARY OF THE INVENTION

I have invented an integrated circuit including polycells having a clock driver which is built under positive and negative ($V_{DD}/V_{SS}$) power supply conductors. These conductors are illustratively the second-level metal conductors in a IC having three or more metal levels, wherein the first metal level serves to distribute the power supply along a row of polycells. The gates of the transistors in at least one stage of the clock driver are placed parallel with respect to the row axis, and hence orthogonally to the transistor gates in the polycells along the row.

DETAILED DESCRIPTION

The following detailed description relates to an integrated circuit (IC) including polycells having a clock driver which is built under positive and negative ($V_{DD}/V_{SS}$) power supply spines. An illustrative case is shown in CMOS technology wherein these spines are the second-level metal conductors in an IC that has three metal levels. However, the inventive technique is possible in IC's that include still more conductor levels. In a preferred embodiment, at least the p-channel transistor in the output stage of the clock driver lies under the $V_{DD}$ spine, and at least the n-channel transistor in the output stage of the clock driver lies under the $V_{SS}$ spine. This arrangement allows for readily connecting the sources of these transistor directly to the respective overhead spine. Furthermore, the gates of the clock driver transistors at least in the output stage are placed orthogonally with respect to the transistor gates in the polycells. This allows a clock driver output conductor to be readily provided, and can provide for other layout advantages in three (or more) metal level designs.

Figure 2:
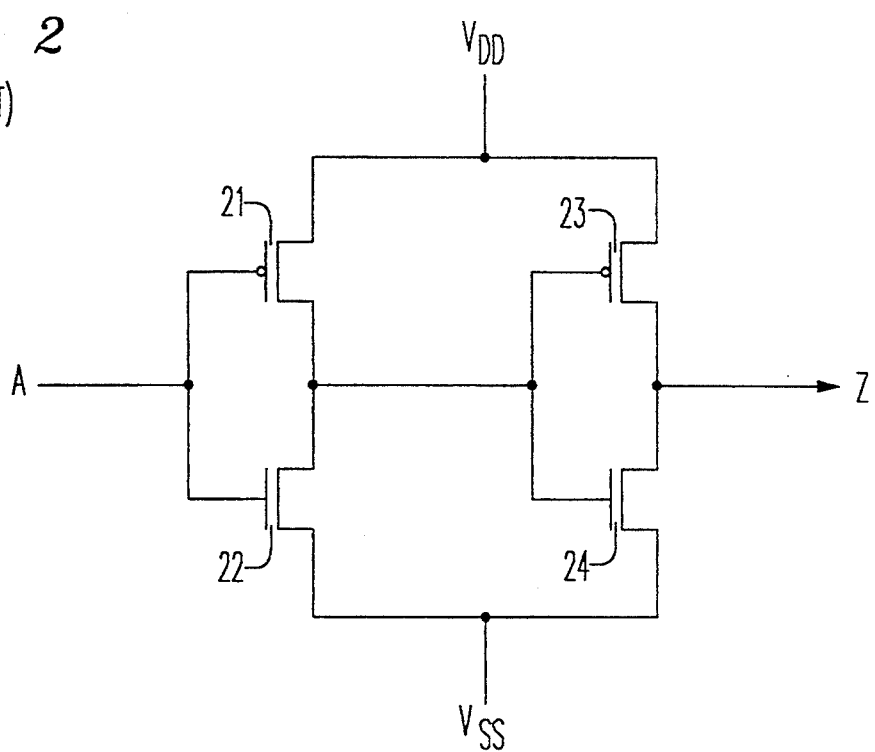
FIG. 2 shows schematically a prior-art two-stage clock driver.
Figure 3:
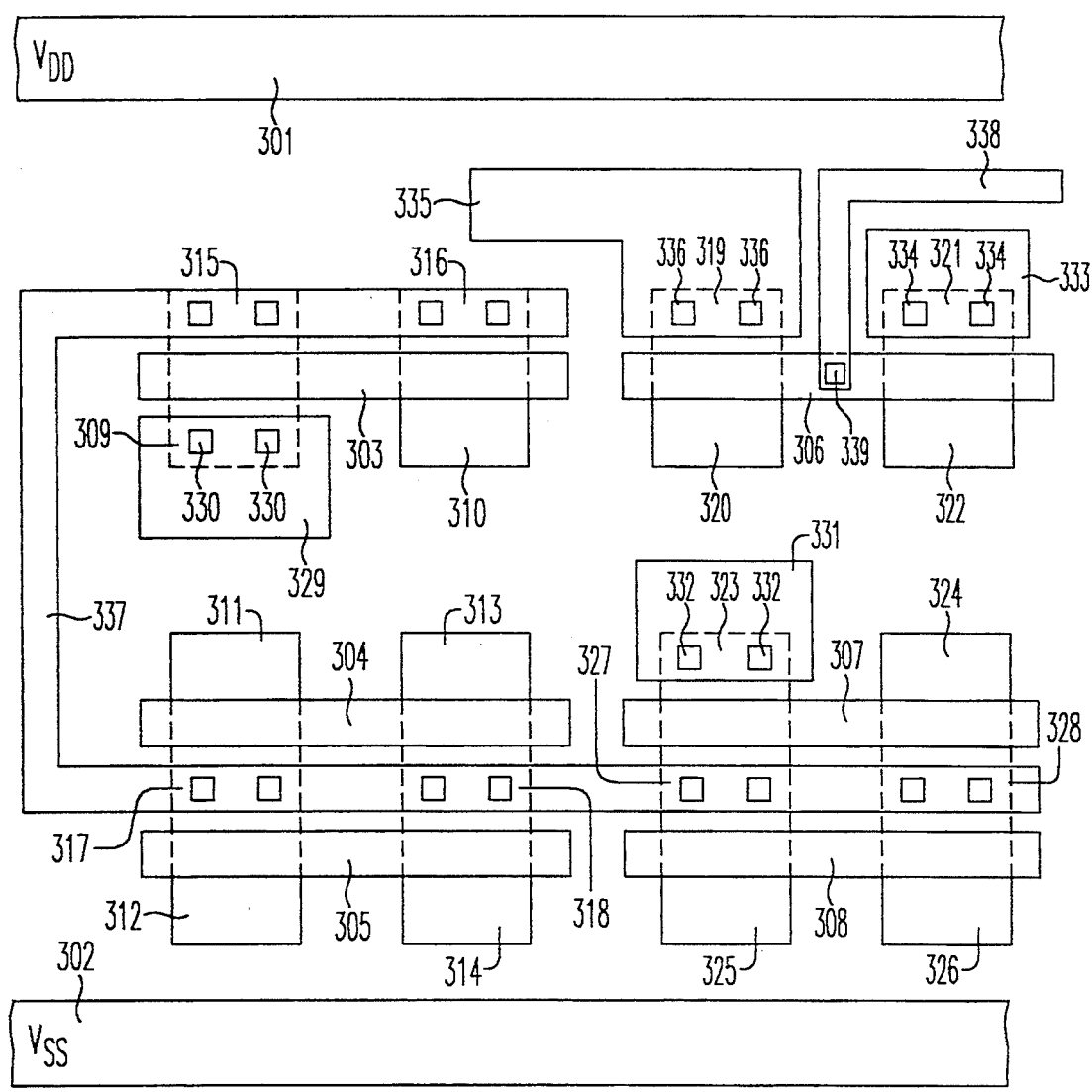
FIGS. 3 and 4 show an illustrative physical layout of a clock driver implemented according to the inventive technique.
Figure 4:
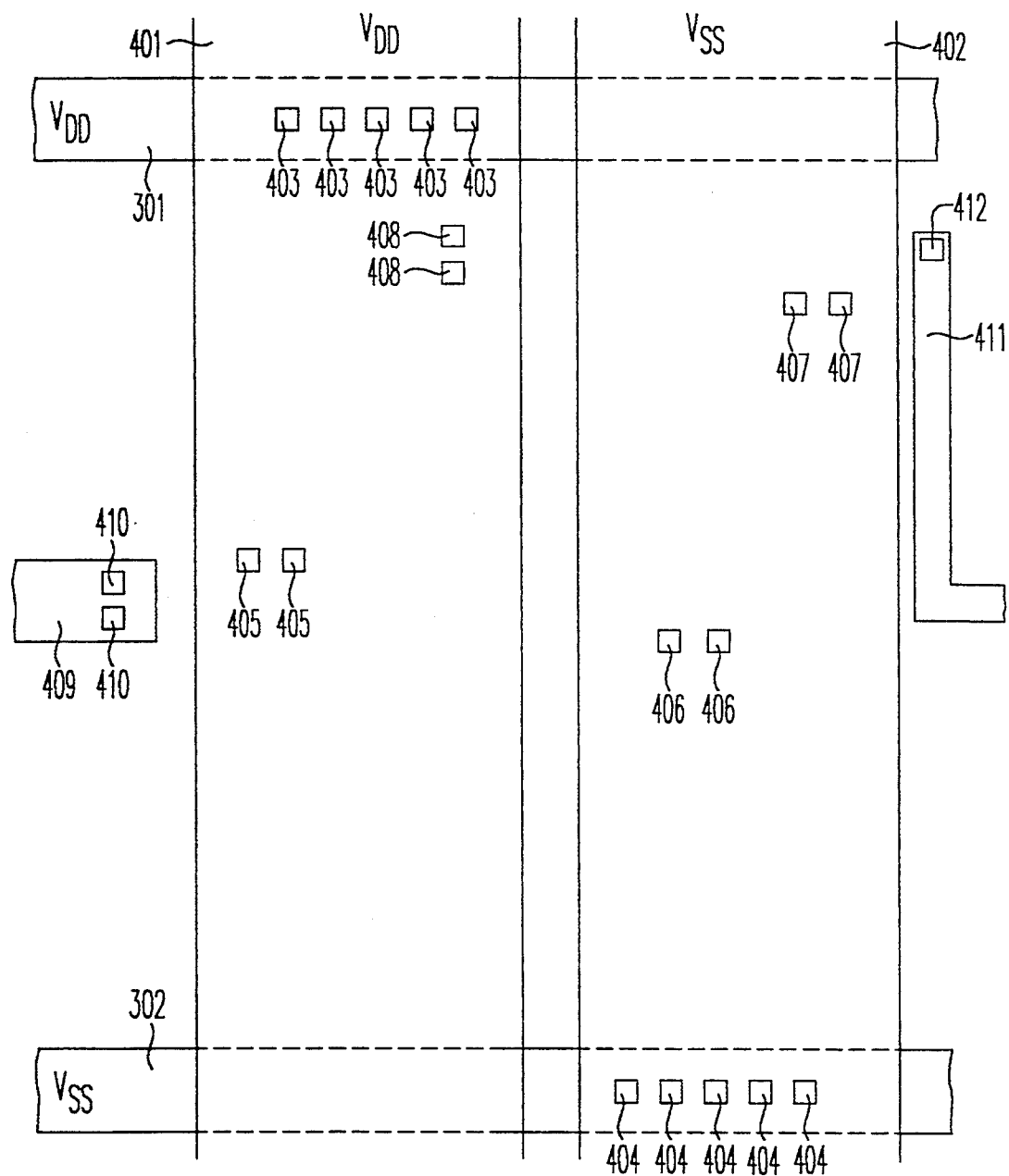

Referring to FIG. 3, one embodiment of the present technique is shown in the form of an illustrative layout of a two-stage clock driver (FIG. 2). The transistors in the clock driver are formed in the rows under the metal2 power supply spines to be formed there-over as shown in FIG. 4. For example, in the embodiment of FIG. 3, the gate conductors 303-305 and associated p-type source regions (309-314) and p-type drain regions (315-318) comprise the pull-up transistor 23 of the second clock stage shown schematically in FIG. 2. The gate conductors 307 and 308, and associated n-type source regions (323-326) and n-type drain regions (327-328) comprise the pull-down transistor 24 of the second clock stage. Similarly, the gate conductor 306 and associated p-type source region 319 and p-type drain region 320 comprise the pull-up transistor 21 in the first clock stage, whereas the gate conductor 306 and n-type source region 321 and n-type drain region 322 comprise the pull-down transistor 22.

Referring to FIG. 4, the vertical (as viewed) power supply spines 401, 402 are implemented in metal2, and conduct the $V_{DD}$ and $V_{SS}$ power supply voltages, respectively, to the horizontal (as viewed) power supply bus conductors 301,302 in the illustrated row. This is accomplished by means of conductive "vias" that are formed in openings in the dielectric layer (not shown) between metal1 and metal2. The vias 403 connect the $V_{DD}$ spine 401 to the $V_{DD}$ bus 301, whereas the vias 404 connect the $V_{SS}$ spine 402 to the $V_{SS}$ bus 302. In addition, the spines may also conduct the power supply voltages to the horizontal bus conductors in one or more other rows (not shown) lying parallel to the illustrated row. Therefore, the size of the spines, (both width and thickness) are designed to carry the current required by the circuitry in the one or more rows connected thereto. Note however that more than one set of vertical spines is typically provided (i.e., to the left and right of the row portion viewed), with the required current being apportioned among them.

The above-described arrangement allows for readily connecting the source regions of the clock driver transistors to the appropriate power supply ($V_{DD}/V_{SS}$) spines by means of low-resistance contacts, which may include contact windows as vias of a type known in the art. For example, referring again to FIG. 3, a metal1 "landing pad" 329 is typically provided to facilitate this connection, wherein contact windows are formed in the dielectric layer (not shown) between the pad 329 and the source 309. This landing pad provides a low-resistance contact region that may be readily contacted by conductive vias (405 in FIG. 4) that connect it, and hence source 309, to the $V_{DD}$ spine 401, which is formed there-over (as shown in FIG. 4). In a similar manner, the other p-type source regions (310-314) in the output stage p-channel transistor (23) may advantageously be located under the $V_{DD}$ spine 401, contacting the spine by means of metal1 landing pads and associated contact windows and vias, which are not shown for clarity.

Conversely, the n-type source regions 323-326 in the second stage clock driver n-channel transistor 24 are advantageously located under the $V_{SS}$ spine 402. This allows for low-resistance contacts to the spine 402, as from source region 323 by means of metal1 landing pad 331, contact windows 332, and vias 406. The other source regions of transistor 24 may be similarly connected to spine 402 by means of other landing pads, not shown for clarity. In some IC process technologies, it is even possible to connect the metal2 spines (401,402) to the source regions of the second-stage clock driver transistors (23, 24) without landing pads, by contact windows that span the two metal levels from the spines down to these source regions. Either case, with or without intervening conductive landing pads, is considered to be a "direct connection" to the spines. Note that a direct connection to the spines avoids having to carry the power supply current to these clock driver transistors through the row power supply conductors (301,302). As a result, there is a significant improvement in electromigration design characteristics, as discussed further below.

As for the transistors in the first clock driver stage (21, 22), they may be located under either a $V_{DD}$ or $V_{SS}$ power supply spine, and in the example shown, these transistors are located under the $V_{SS}$ spine 402. The n-type source region 321 (of transistor 22) contacts the $V_{SS}$ spine 402 by means of metal1 landing pad 333, contact windows 334, and vias 407. The p-type source region 319 (of transistor 21) contacts the $V_{DD}$ spine 401 by means of metal1 landing pad conductor 335, contact windows 336, and vias 408. Note that even though landing pad conductor 335 extends a longer distance than the other landing pads, it still provides a direct contact to the $V_{DD}$ power supply spine 401 without the necessity of conducting additional current through the $V_{DD}$ bus 301. Hence, benefits in terms of electromigration trade-offs, and the advantages of a compact clock driver layout under the spines, are still obtained.

It can be seen that the gates, as defined by gate conductors 303–308, of these clock driver transistors lie parallel to the polycell row (and parallel to $V_{DD}/V_{SS}$ busses 301 and 302). This results in a transistor orientation that makes it possible to readily form input and output connections to the clock driver stages by means of the same conductor level (e.g.,metal1) that forms the landing pads for the source regions. That is, the metal1 output conductor 337 contacts the drain regions 315, 316, 317, 318, 327 and 328, and exits the clock driver to the left of the $V_{DD}$ spine 401, without having to cross over any of the gate conductors 303, 304, 305, 307 or 308. Furthermore, output conductor 337 does not cross over any of the source regions 309, 310, 311, 312, 313, 314, 323, 324, 325 or 326, which would require conductor 337 to be formed in a different conductor level than that of the landing pads (e.g., 329) that contact the source regions. The transistors of the input stage are similarly oriented parallel to the rows in the illustrative embodiment. However, this need not be the case, since the input stage need not provide an output conductor to the polycells. That is, the layout of the input stage may also accommodate transistor gates oriented orthogonally to the rows, as with the logic polycell transistors. In fact, the input stage need not be located under the spine conductors at all, but may be located in the row along with the polycells, while still obtaining the benefits of the present invention for the high-current drive output stage.

With the clock driver output stage oriented as shown in FIG. 3, upon exiting from under the spine 401, the output conductor 337 may then readily contact a metal2 conductor 409 by means of vias 410 (FIG. 4), in order to supply the clock signal to the polycells in the row lying on the left of the power supply spines. Polycells to the right of the power supply spines, or alternatively in other rows, may also be provided from this clock driver by means of the appropriate metal3 conductors (not shown). Similarly, the metal1 clock driver input conductor 338 connects the gate conductor 306 (through window 339) to a clock source, typically through a metal2 conductor 411 connected thereto by means of via 412 (FIG. 4). The connection between the drain regions (320, 322) of the clock dryer transistors (21, 22) in the input stage may also be provided by metal1 conductors, not shown for clarity, as may the connection therefrom to the gate conductors (303, 304, 305, 307 and 308) of the second stage.

Figure 1:
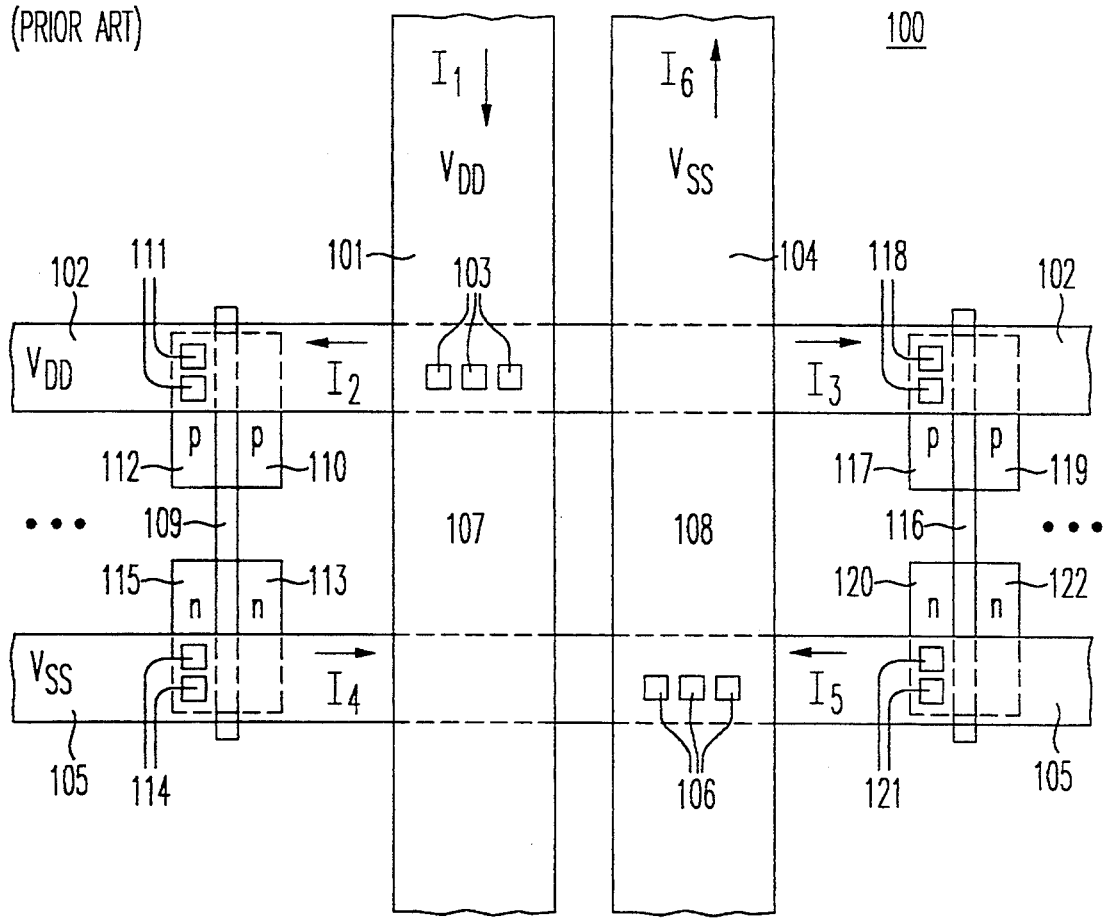
FIG. 1 shows the physical layout of an illustrative prior-art polycell design.

Note that although the transistors in the clock driver stage are oriented parallel to the rows, the transistors in the logic polycells are oriented (e.g., have gate conductors) lying orthogonally to the rows, as is conventional in the art. These may be as shown by the transistor regions lying to the left and fight of the spine regions, as shown in FIG. 1. In addition to the above-noted conductor layers, the metal3 conductors in a typical three-level metal technology (not shown) may then used to provide inter-cell connections; that is, signal paths between the inputs and outputs of the various polycells. Still additional metal layers may be included to facilitate in implementing various of the above functions, or provide still additional circuit functions.

At least some of the following advantages are typically obtained with the inventive practice:

(1) The placement of the specific transistor types under their respective metal2 bus allows for easy access to the metal2 bus which eliminates the need for these transistors to "add to" the current flowing through the metal1 $V_{DD}/V_{SS}$ buses in the polycell row. Therefore the designer, when designing the floorplan for the core logic and power bus strategy within the core, need only be concerned with the polycells when designing the core to meet the electromigration guidelines.

(2) Electromigration concerns within the clock driver itself are easily eliminated by placing at least some of the p-channel transistors under the metal2 $V_{DD}$ bus and at least some of the n-channel transistors under the metal2 $V_{SS}$ bus. The elimination is accomplished because of the easy access to the metal2 buses.

(3) There is also cause for electromigration concern on the metallization of the output of the clock driver, since the clock driver typically drives large capacitive loads. The orthogonal layout scheme allows for wide metal busing on the output node and thus elimination of the electromigration concern.

(4) The orthogonal layout scheme allows for full contact of the transistors source and drain nodes, which reduces series contact resistance to the transistor, especially in a non-salicided process technology.

(5) Since the clock driver circuitry is built to fit into a row height, the total drive capability of an individual clock driver may be relatively small. However, it is easy to parallel individual clock drivers into a main clock in the same vertical section, or spine, by connecting the inputs together, as by means of a metal2 input line, and by connecting the outputs together, as by means of the metal2 output line.

Furthermore, more than one main clock driver can be placed in a "spine" by adding an input and output metal2 line to the spine for each additional clock driver. For example, assume that there are two main clock drivers in one spine and each clock driver requires 15 individual clock driver circuits in parallel. The minimum spine height must be at least 30 rows high (typical chips average 50 to 70 rows). The metal2 structure of the spine would require six buses, clock1 in, clock2 in, clock1 out, clock2 out, $V_{DD}$, and $V_{SS}$. Fifteen of the individual clock drivers would be connected to clock1 in and clock1 out, while the other fifteen would be connected to clock2 in and clock2 out. The $V_{DD}$ and $V_{SS}$ metal2 buses would support all thirty clock drivers.

While an integrated circuit according to the inventive technique implements at least a portion of its functionality with polycells, still other portions may utilize other layout techniques. Furthermore, while CMOS integrated circuit technology has been illustrated herein, other technologies may advantageously use the inventive technique. For example, if a technology having only single-conductivity transistors is used, then both the pull-up and pull-down transistors in a given clock stage could still utilize the inventive layout, albeit with a different (e.g., phase-split) input arrangement. Finally, metal conductor levels (typically aluminum or tungsten) have been described herein for each of the three conductor levels above the gate conductor level, with doped polysilicon or doped polysilicon/silicide being typical for the gate conductors. However, other conductor types (e.g., silicides, titanium nitride, etc.) may be used in lieu of one or more of the above-described metal conductor levels, especially for the first metal level, which is used for carrying signals between the polycells, but not normally used for power supply purposes.

I claim:

1. An integrated circuit including at least one row of polycells, wherein a first group of positive and negative power supply conductors lying parallel to the axis of the row distribute power supply current to the polycells from a second group of positive and negative power supply conductors lying orthogonally to, and overlying, the first group of power supply conductors; and wherein the polycells in the row have transistor gate conductors that lie orthogonally to the row axis, Characterized in that said integrated circuit further comprises at least one clock driver stage located in said row under at least one conductor in said second group of power supply conductors, and with said clock driver stage comprising a first transistor and a second transistor each having a gate conductor that lies parallel to said row axis.

2. The integrated circuit of claim 1 wherein said first transistor is a p-channel transistor having a source directly connected to said positive power supply conductor in said second group, and said second transistor is an n-channel transistor having a source directly connected to said negative power supply conductor in said second group.

3. The integrated circuit of claim 2 further comprising an additional clock driver stage located under said second group, with said additional clock driver comprising third and fourth additional transistors each having a gate conductor that lies parallel to said row axis, and wherein the third additional transistor is a p-channel transistor having a source directly connected to said positive power supply conductor in said second group, and the fourth additional transistor is an n-channel transistor having a source directly connected to said negative power supply conductor in said second group.

4. The integrated circuit of claim 1 wherein said first group of power supply conductors is formed in a first metal level, and said second group of power supply conductors is formed in a second metal level.

5. The integrated circuit of claim 4 further comprising a third metal level overlying said second metal level and providing interconnection of signal inputs and outputs between two or more rows of said polycells.

6. The integrated circuit of claim 1 wherein said clock driver stage is the output stage.

7. The integrated circuit of claim 6 further comprising at least one additional clock driver stage.

8. An integrated circuit including at least one row of polycells, wherein a first group of positive and negative power supply conductors lying parallel to the axis of the row distribute power supply current to the polycells from a second group of positive and negative power supply conductors lying orthogonally to, and overlying, the first group of power supply conductors; and wherein the polycells in the row have transistor gate conductors that lie orthogonally to the row axis, Characterized in that said integrated circuit further comprises a clock driver output stage located in said row, with said clock driver output stage comprising a first transistor and a second transistor each having a gate conductor that lies parallel to said row axis; and wherein said first transistor is a p-channel transistor lying under, and having a source directly connected to, said positive power supply conductor in said second group; and wherein said second transistor is an n-channel transistor lying under, and having a source directly connected to, said negative power supply conductor in said second group.

9. The integrated circuit of claim 8 further comprising an additional clock driver stage located under said second group, with said additional clock driver comprising third and fourth additional transistors each having a gate conductor that lies parallel to said row axis, and wherein the third additional transistor is a p-channel transistor having a source directly connected to said positive power supply conductor in said second group, and the fourth additional transistor is an n-channel transistor having a source directly connected to said negative power supply conductor in said second group.

10. The integrated circuit of claim 8 wherein said first group of power supply conductors is formed in a first metal level, and said second group of power supply conductors is formed in a second metal level.

11. The integrated circuit of claim 10 wherein said clock driver output stage provides a clock signal to at least one of said polycells by means of a first output conductor formed in said first metal level which connects together the drain regions of said first and second transistors; and with said first output conductor being connected to a second output conductor formed in said second metal level and which connects to said at least one of said polycells.

12. The integrated circuit of claim 11 further comprising a third metal level overlying said second metal level and providing interconnection of signal inputs and outputs between two or more polycells.

* * * * *